US012750945B2

(12) United States Patent
Ali et al.

(10) Patent No.: US 12,750,945 B2
(45) **Date of Patent: *Sep. 29, 2026**

(54) THERMAL-CONTROL SYSTEM OF A MESH NETWORK DEVICE AND ASSOCIATED MESH NETWORK DEVICES

(71) Applicant: Google LLC, Mountain View, CA (US)

(72) Inventors: Ihab A. Ali, Cupertino, CA (US); Frédéric Heckmann, Taipei City (TW)

(73) Assignee: Google LLC, Mountain View, CA (US)

( * ) Notice: Subject to any disclaimer, the term of this patent is extended or adjusted under 35 U.S.C. 154(b) by 270 days.

This patent is subject to a terminal disclaimer.

(21) Appl. No.: 18/623,538

(22) Filed: Apr. 1, 2024

(65) Prior Publication Data

US 2024/0251498 A1 Jul. 25, 2024

Related U.S. Application Data

(63) Continuation of application No. 17/767,683, filed as application No. PCT/US2020/054810 on Oct. 8, 2020, now Pat. No. 11,997,781.

(Continued)

(51) Int. Cl.

| | |
|---|---|
| ***H05K 7/20*** | (2006.01) |
| ***H05K 1/02*** | (2006.01) |
| ***H05K 9/00*** | (2006.01) |

(52) U.S. Cl.

CPC ........... *H05K 1/0203* (2013.01); *H05K 7/202* (2013.01); *H05K 7/20509* (2013.01);

(Continued)

(58) Field of Classification Search

CPC .... H05K 1/203; H05K 7/20154; H05K 7/202; H05K 7/2039; H05K 7/20509; H05K 2201/09027; H05K 9/0024

See application file for complete search history.

(56) References Cited

U.S. PATENT DOCUMENTS

| | | | |
|---|---|---|---|
| 7,839,630 | B2 | 11/2010 | Hwang et al. |
| 9,282,681 | B2 | 3/2016 | Rugg |

(Continued)

FOREIGN PATENT DOCUMENTS

| | | |
|---|---|---|
| CN | 106462204 | 2/2017 |
| KR | 20160103871 | 9/2016 |

(Continued)

OTHER PUBLICATIONS

"Foreign Office Action", EP Application No. 20800404.4, Apr. 18, 2024, 10 pages.

(Continued)

*Primary Examiner* — Mandeep S Buttar

(74) *Attorney, Agent, or Firm* — Colby Nipper PLLC

(57) ABSTRACT

This document describes a thermal-control system (110) that may be integrated into a mesh network device (102) and associated mesh network devices. The thermal-control system (110), which may include a heat sink (112), multiple heat spreaders (114, 118), and a heat shield (116), is such that heat (106) originating from IC devices populating a printed circuit board (104) of the mesh network device (102) may be transferred to a housing component (108) of the mesh network device (102) for external dissipation to maintain a desired thermal profile of the mesh network device (102).

20 Claims, 8 Drawing Sheets

Related U.S. Application Data

(60) Provisional application No. 62/913,904, filed on Oct. 11, 2019.

(52) U.S. Cl.
CPC ....... *H05K 9/0024* (2013.01); *H05K 7/20154* (2013.01); *H05K 7/2039* (2013.01); *H05K 2201/09027* (2013.01)

(56) References Cited

U.S. PATENT DOCUMENTS

| | | | | |
|---|---|---|---|---|
| 9,715,904 | B2 | 7/2017 | Rugg | |
| 10,299,405 | B2 | 5/2019 | Chang et al. | |
| 11,202,341 | B2 | 12/2021 | Lee et al. | |
| 11,457,545 | B2 | 9/2022 | Heckmann et al. | |
| 11,521,909 | B2 | 12/2022 | Ali et al. | |
| 11,744,007 | B2 | 8/2023 | Lee et al. | |
| 11,812,583 | B2 | 11/2023 | Heckmann et al. | |
| 11,852,957 | B2 | 12/2023 | Ali et al. | |
| 11,997,781 | B2 | 5/2024 | Ali et al. | |
| 2010/0177482 | A1 | 7/2010 | Spivey | |
| 2011/0037367 | A1 | 2/2011 | Wang et al. | |
| 2011/0198978 | A1 | 8/2011 | Sawyer et al. | |
| 2012/0057356 | A1 | 3/2012 | Hizer et al. | |
| 2015/0382448 | A1 | 12/2015 | Pennathur et al. | |
| 2015/0382508 | A1* | 12/2015 | Tatta | H05K 7/20409 361/715 |
| 2017/0347172 | A1 | 11/2017 | Kim et al. | |
| 2018/0042139 | A1* | 2/2018 | Rosales | H05K 1/0203 |
| 2018/0343403 | A1 | 11/2018 | Mehdi et al. | |
| 2018/0343772 | A1 | 11/2018 | Raghupathy et al. | |
| 2019/0021184 | A1 | 1/2019 | Williams et al. | |
| 2019/0045674 | A1 | 2/2019 | Liang | |
| 2019/0104640 | A1* | 4/2019 | Chang | H05K 7/20209 |
| 2019/0200872 | A1 | 7/2019 | Matsuoka et al. | |
| 2019/0205655 | A1 | 7/2019 | Matsuoka et al. | |
| 2020/0196038 | A1 | 6/2020 | Curtiss et al. | |
| 2021/0111095 | A1 | 4/2021 | Ali et al. | |
| 2022/0109222 | A1 | 4/2022 | Heckmann et al. | |
| 2023/0139054 | A1* | 5/2023 | Ali | H05K 7/202 361/697 |

FOREIGN PATENT DOCUMENTS

| | | |
|---|---|---|
| WO | 2016045120 | 3/2016 |
| WO | 2018125632 | 7/2018 |
| WO | 2021072096 | 4/2021 |

OTHER PUBLICATIONS

"Extended European Search Report", EP Application No. 20200820.7, Mar. 5, 2021, 10 pages.
"Extended European Search Report", EP Application No. 20201375.1, Mar. 11, 2021, 6 pages.
"Final Office Action", U.S. Appl. No. 17/064,372, filed Mar. 29, 2023, 16 pages.
"Foreign Office Action", EP Application No. 20200820.7, Jan. 19, 2023, 4 pages.
"Foreign Office Action", CN Application No. 202011073776.8, May 13, 2023, 14 pages.
"Foreign Office Action", CN Application No. 202011073776.8, Nov. 15, 2022, 19 pages.
"International Preliminary Report on Patentability", Application No. PCT/US2020/054810, Apr. 12, 2022, 13 pages.
"International Search Report and Written Opinion", Application No. PCT/US2020/054810, Jan. 29, 2021, 18 pages.
"Non-Final Office Action", U.S. Appl. No. 17/064,372, filed Nov. 7, 2022, 14 pages.
"Notice of Allowance", U.S. Appl. No. 17/064,372, filed Jul. 3, 2023, 11 pages.
"Notice of Allowance", U.S. Appl. No. 17/767,683, filed Jan. 31, 2024, 10 pages.

* cited by examiner

THERMAL-CONTROL SYSTEM OF A MESH NETWORK DEVICE AND ASSOCIATED MESH NETWORK DEVICES

CROSS-REFERENCE TO RELATED APPLICATION(S)

This application is a continuation of and claims priority to U.S. Non-Provisional patent application Ser. No. 17/767,683, filed on Apr. 8, 2022, which in turn is a national stage entry of and claims priority to International Patent Application Serial No. PCT/US2020/054810, filed on Oct. 8, 2020, which in turn claims the benefit of U.S. Provisional Patent Application Ser. No. 62/913,904 filed on Oct. 11, 2019, the disclosures of which are incorporated by reference herein in their entireties.

BACKGROUND

A mesh network is a network that includes multiple nodes that link together to improve network performance and network accessibility. As an example, a mesh network supporting a wireless local area network (WLAN) may include multiple wireless nodes linking together across an area. Each wireless node, or mesh network device, may provide wireless devices access to the WLAN exchange network information with other mesh network devices. The aggregate functions of the multiple mesh network devices, in general, improve connectivity to the WLAN across the area and improve efficiency of data exchange.

In some instances, the mesh network device may be a range-extending mesh network device. The mesh network device may be a small form factor and include multiple electronic subsystems that generate heat. Examples of such electronic subsystems include a printed circuit board (PCB) populated with a variety of integrated circuit (IC) devices.

To dissipate heat from electronic subsystems and avoid degradation of the electronic subsystems, a thermal-control system may be used. The design and architecture of an efficient and effective thermal-control system that maintains a small form factor presents multiple challenges.

SUMMARY

This document describes a thermal-control system that is integrated into a mesh network device and associated mesh-network devices. The thermal-control system, which may include a heat sink, multiple heat spreaders, and a heat shield, is such that heat originating from IC devices, populating a PCB of the mesh network device, may be transferred to a housing component of the mesh network device for external dissipation to maintain a desired thermal profile of the mesh network device.

In some aspects, an apparatus is described. The apparatus includes a PCB that is populated with one or more IC devices and that is generally circular about a central axis. The apparatus further includes a thermal-control system to transfer heat generated by the one or more IC devices to a housing component of the apparatus for external dissipation. The thermal-control system includes a heat sink that is generally cylindrical and centered about the central axis. The heat sink includes an interior disk-like body that is substantially orthogonal to the central axis and in thermal contact with at least one of the IC devices. The thermal-control system also includes (i) a first heat spreader that is generally planar and attached to a first surface of the interior disk-like body, and (ii) a heat shield that faces a second, opposite surface of the interior disk-like body.

In other aspects, an apparatus is described. The apparatus includes a housing component that has an internal cavity region that is generally concave and symmetrical about a central axis. The apparatus further includes a thermal-control system configured to be positioned within the housing component and transfer heat generated by one or more IC devices to the housing component for external dissipation.

The thermal-control system includes a heat sink that is generally cylindrical, is centered about the central axis, and includes a disk-like body. The disk-like body is substantially orthogonal to the central axis, includes a first surface that faces the internal cavity region of the housing component, and is in thermal contact with at least one of the one or more IC devices. The thermal-control system also includes a fan mechanism that is located between the internal cavity region and the first surface of the heat sink. The fan mechanism has one or more blades that rotate about the central axis. The thermal-control system also includes a heat spreader that is (i) generally planar, (ii) attached to the first surface of the heat sink, and (iii) located between the one or more blades and the first surface of the heat sink.

The details of one or more implementations are set forth in the accompanying drawings and the following description. Other features and advantages will be apparent from the description, the drawings, and the claims. This Summary is provided to introduce subject matter that is further described in the Detailed Description and Drawings. Accordingly, a reader should not consider the Summary to describe essential features nor limit the scope of the claimed subject matter.

BRIEF DESCRIPTION OF THE DRAWINGS

The details of one or more aspects of a thermal-control system for a mesh network device and associated mesh network devices are described below. The use of the same reference numbers in different instances in the description and the figures may indicate like elements.

DETAILED DESCRIPTION

Figure 1:
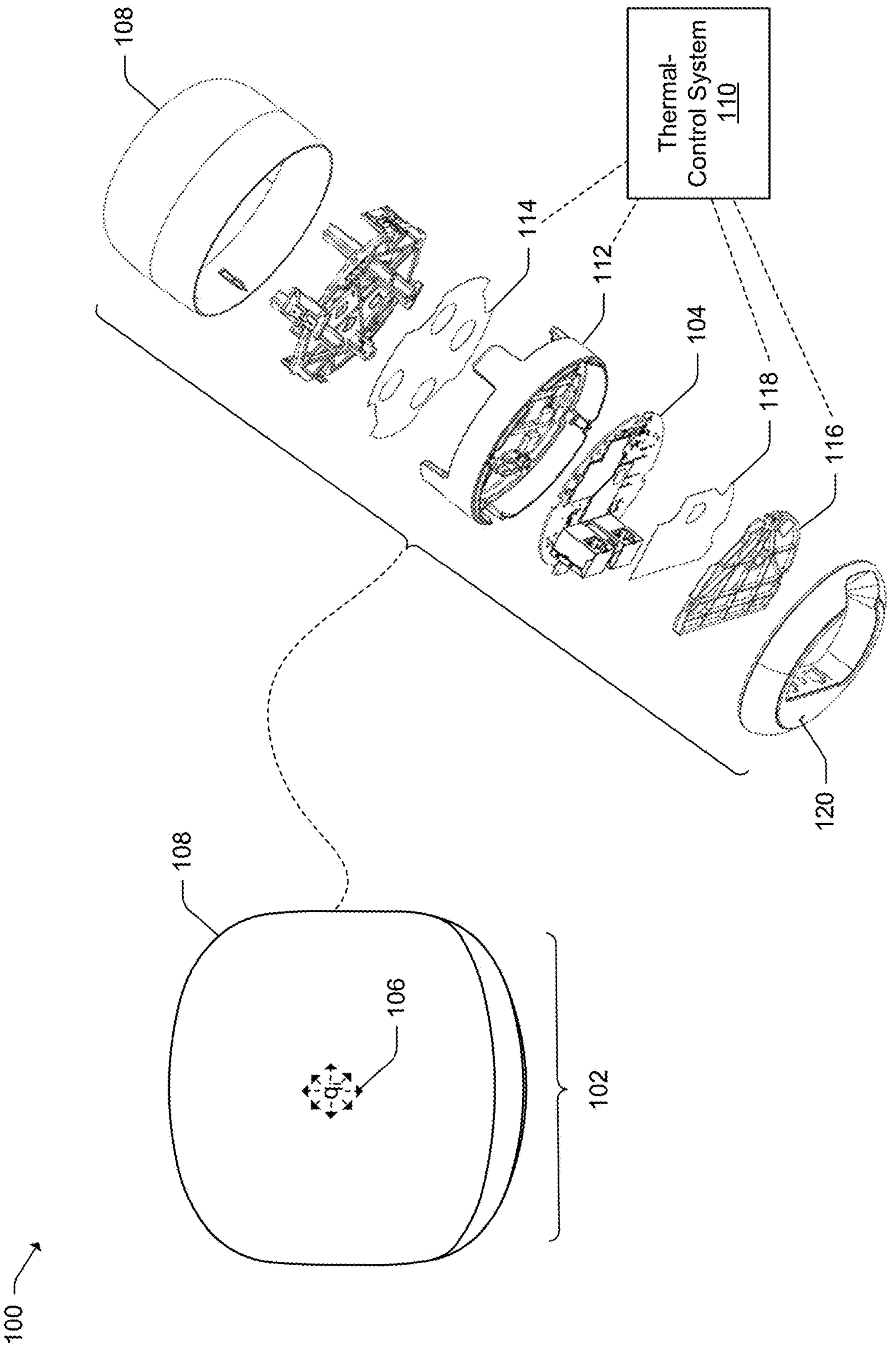
FIG. 1 illustrates example details including a front isometric view and an exploded view of a mesh network device 102.

This document describes a thermal-control system that is integrated into a mesh network device. The architecture of the thermal-control system is such that heat is conducted from IC devices populating a PCB to other components, for example, a housing component of the mesh network device, for dissipation to maintain a desired thermal profile of the mesh network device.

Heat transfer, in general, is energy that is in transit due to a temperature difference. If one or more temperature differences exist across components of a system, such as the mesh network device, heat (e.g., energy in Joules (J)) will transfer from higher temperature zones to lower temperature zones to reduce the temperature differences. There are several mechanisms for heat transfer across the components of the system to reduce temperature differences, including convection, radiation, and conduction.

Convection, or heat transfer from a surface due to movement of molecules within fluids such as gases and liquids, may be quantified by equation (1) below:

$$q_{conv} = hA\ (T_s - T_\infty) \tag{1}$$

For equation (1), $q_{conv}$ represents a rate of heat transfer from a surface through convection (e.g., in J per second or Watts (W)), h represents a convection heat transfer coefficient (e.g., in W per meter squared ($W/m^2$)), $T_s$ represents a temperature of a surface (e.g., in Kelvin (K) or degrees Celsius (° C.)), and $T_\infty$ represents a temperature of a fluid (e.g., in K or ° C.) to which the surface is exposed. The term A represents an area of a surface (e.g., in $m^2$).

Radiation, or heat transfer from a surface through electromagnetic radiation, may be quantified by equation (2) below:

$$q_{rad} = \varepsilon A\sigma\left(T_s^4 - T_{surr}^4\right) \tag{2}$$

For equation (2), $q_{rad}$ represents a rate of heat transfer through radiation (e.g., in W), ε represents emissivity (dimensionless), σ represents the Stefen-Boltzmann constant (e.g., $\sigma=5.67\times10^{-8}\ W/(m^2\cdot K^4)$), $T_s$ represents a temperature of a surface (e.g., in K or ° C.), and $T_{surr}$ represents a temperature of surroundings of the surface (e.g., in K or ° C.). The term A represents an area of the surface (e.g., in $m^2$).

Conduction, or heat transfer through a solid body through atomic and molecular activity, may be quantified by equation (3) below:

$$q_{cond} = -kA\frac{dT}{dx} \tag{3}$$

For equation (3), $q_{cond}$ represents a rate of heat transfer in a solid material through conduction (e.g., in W), k represents a thermal conductivity of the solid material (e.g., in $W/(m\cdot K)$), and dT/dx represents a temperature gradient through the solid material (e.g., in K/m or ° C./m). The term A represents a cross-sectional area of the solid material (e.g., in $m^2$).

In instances of heat transfer from one physical body to another, through one or more of a convection heat-transfer mechanism, a radiation heat-transfer mechanism, or a conduction heat-transfer mechanism, the physical bodies may be in thermal contact. In some instances, this can include direct physical contact between the bodies or a material (e.g., a thermal interface material, or TIM) located between the bodies, enabling conduction-based heat transfer between the bodies. In other instances, this can include an air gap between the bodies that enables convection-based and/or radiation-based heat transfer between the bodies.

A mesh network device may include a thermal-control system that transfers heat using one or more of the heat-transfer mechanisms described above. In general, and in accordance with equations (1) and (2), rates and/or quantities of heat transfer can be varied by increasing or decreasing surface areas for convection and/or radiation within the mesh network device (e.g., increasing or decreasing surface areas of planar heat spreaders). In accordance with equation (3) and within the thermal-control system of the mesh network device, rates and/or quantities of heat transfer can also be varied by introducing, between surfaces, one or more TIMs that have a high thermal conductivity.

Through conduction, convection, and radiation heat-transfer mechanisms, as described and quantified by equations (1)-(3) above, the thermal-control system may transfer heat originating from heat-generating electronic devices within the mesh network device to an interior surface of a housing component of the mesh network device. An exterior surface of the housing component may then dissipate the heat to an external environment through convection and/or radiation, effective to prevent degradation of electronic subsystems that may include the heat-generating electronic devices.

While features and concepts of the described thermal-control system can be implemented in any number of different environments, apparatuses, and/or various configurations, aspects are described in the context of the following examples.

FIG. 1 illustrates example details 100 including a front isometric view and an exploded view of a mesh network device 102. The mesh network device 102 includes multiple electronic subsystems, including a PCB 104 populated with one or more IC devices. The mesh network device 102 may serve as a node of a wireless mesh network (e.g., a WLAN network conforming to IEEE 802.11 communication protocols (Wi-Fi)). In general, the mesh network device 102 may wirelessly couple other wireless devices (e.g., a wireless phone, a laptop computer) to the wireless mesh network.

In general, and while performing operations (e.g., wirelessly coupling the other devices, transferring data), the one or more IC devices populating the PCB 104 may generate an internal heat load 106 (e.g., $q_i$, as measured in W) within the mesh network device 102. To manage the internal heat load 106 within the mesh network device 102 (e.g., prevent thermal runaway or damage to electronic subsystems of the mesh network device 102), the internal heat load 106 may be externally dissipated by elements of the mesh network device 102, for example, the housing component 108.

The thermal-control system 110 may include multiple elements, including a heat sink 112 and a heat-sink heat spreader 114. Furthermore, the thermal-control system may include a heat shield 116 and a heat-shield heat spreader 118. In some instances, the thermal-control system 110 may include additional features that aid in heat transfer, such as one or more TIMs and/or a fan. Furthermore, and depending on configurations of thermal-control system 110, portions of the internal heat load 106 transferred to the housing component 108 may vary.

The heat sink 112 may be generally cylindrical in shape and die-cast from a metal material (e.g., an aluminum material, a magnesium material). The heat-sink heat spreader 114 may be generally circular or elliptical in shape and substantially conform to a shape of a surface of the heat sink 112 on which the heat-sink heat spreader 114 is to be mounted. The heat-sink heat spreader 114 may also be generally planar, formed from one or more sheets of a graphite material.

The elements of the thermal-control system 110 (e.g., the heat sink 112, the heat-sink heat spreader 114, the heat shield 116, the heat-shield heat spreader 118) conduct, spread, and transfer the internal heat load 106 (e.g., a rate of heat transfer $q_i$ in Watts) to the housing component 108 of the mesh network device 102. In some instances, the heat shield 116 may include a plastic material that impedes heat transfer to a base 120 of the mesh network device, forcing heat to be transferred to the housing component 108. The housing component 108 may then dissipate the internal heat load 106 (e.g., using a convection heat-transfer mechanism and/or a radiation heat-transfer mechanism) to an external environment.

In general, one or more sidewalls of the housing component 108 and/or the base 120 may be varied in thickness and/or length. Such changes in the sidewalls of the housing component and/or the base may change heat transfer characteristics of the thermal-control system 110.

The thermal-control system 110 further maintains a desired thermal profile of the mesh network device 102. As an example, the conduction, spreading, and transfer of the internal heat load 106 by the thermal-control system 110 may maintain a surface temperature of the housing component 108 at or below a temperature of approximately 67 degrees Celsius (° C.) while the mesh network device 102 is operating in ambient conditions of 25° C. The thermal-control system 110 may also maintain junction temperature of the IC devices populating the PCB 104 at or below different respective temperature thresholds.

Figure 2:
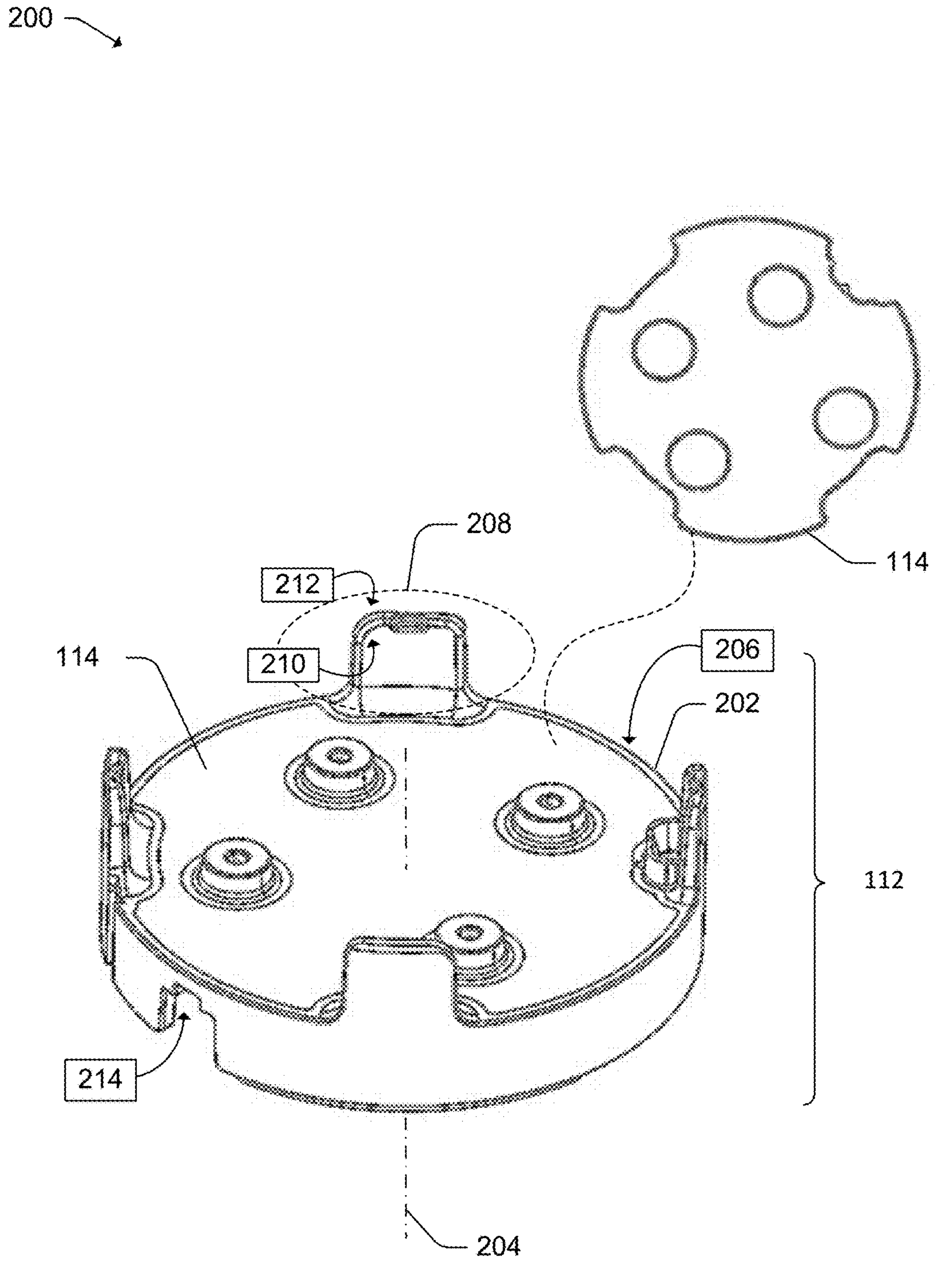
FIG. 2 illustrates an exploded isometric view of an example heat sink that may be included in a thermal-control system of a mesh network device.

FIG. 2 illustrates an isometric-view 200 of the heat sink 112 and heat-sink heat spreader 114. In some instances, the heat sink 112 and the heat-sink heat spreader may be included as part of a mesh network device (e.g., the mesh network device 102 of FIG. 1).

As illustrated, the heat sink 112 includes a body 202 that is generally disk-like (e.g., middle region of the heat sink 112) extending radially from a central axis 204 to define a perimeter. The body 202 includes a first surface 206 (located under the heat-sink heat spreader 114 in FIG. 2) that is substantially orthogonal to the central axis 204. The first surface 206 may be generally planar.

The heat-sink heat spreader 114 may be attached to the first surface 206 of the body 202 (e.g., using a thermally conductive epoxy). Further, the heat-sink heat spreader 114 may be positioned coaxially with the heat sink 112, according to the central axis 204. In some instances, the heat-sink heat spreader 114 may include holes, cutouts, and/or reliefs to avoid interferences with features that may be included as part of the first surface 206.

In some instances, the heat-sink heat spreader 114 may spread and transfer heat to the body 202 using a conduction heat-transfer mechanism. In other instances, the heat-sink heat spreader 114 may spread and transfer heat to a surrounding environment (e.g., an internal cavity region within the housing component 108 of FIG. 1) using a convection heat-transfer mechanism and/or a radiation heat-transfer mechanism. For example, the heat-sink heat spreader 114 may spread and transfer heat in a generally outward direction away from the first surface 206 of the body 202 of the heat sink 112.

The heat-sink heat spreader 114 may include one or more sheets (e.g., layers) of a thermally conductive material such as a graphite material. The heat-sink heat spreader 114 may also include a pressure-sensitive adhesive (PSA) material. Furthermore, different types of materials may be selected to increase or decrease emissivity (ε) and alter radiation characteristics of the heat-sink heat spreader 114.

The heat sink 112 may include one or more fin region(s) 208. Each fin region 208 may extend from the perimeter of the body 202 in one or more directions that are substantially parallel to the central axis 204. Furthermore, each fin region 208 may include an interior surface 210 and an opposing exterior surface 212. In some instances, each fin region 208 may transfer heat to a surrounding environment (e.g., to the housing component 108 of FIG. 1 or to an internal cavity region within the housing component 108) using one or more of a conduction, convection, and/or radiation heat-transfer mechanism.

The heat sink may also include a second surface 214 (not visible in FIG. 2). In general, the second surface 214 may be generally planar and opposite the first surface 206. In some instances, the second surface may include one or more pedestals (protrusions) that aid in establishing thermal contact with heat-generating devices such as IC devices.

Figure 3:
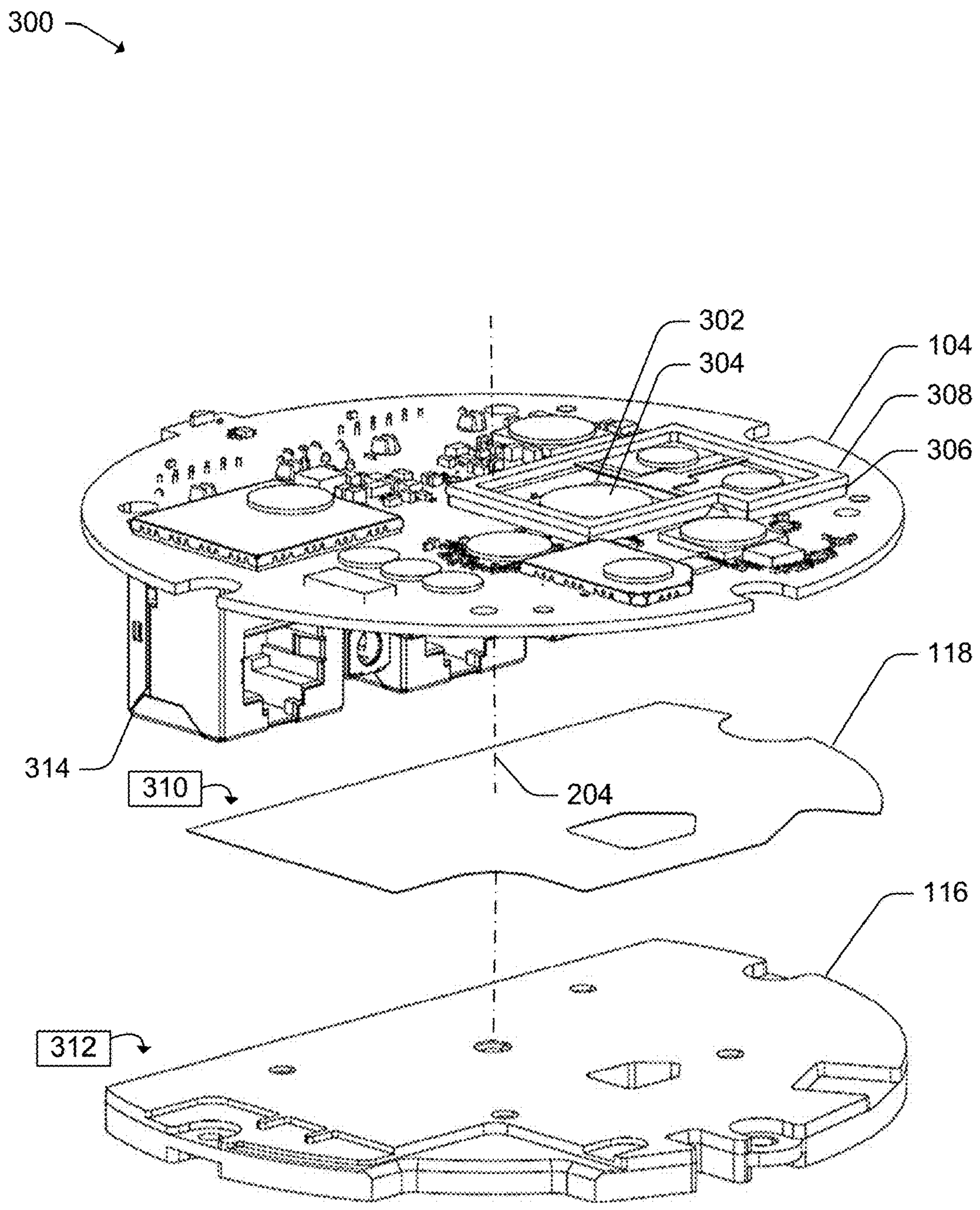
FIG. 3 illustrates an exploded isometric view of a heat spreader and a heat shield that may be included in a thermal-control system of a mesh network device.

FIG. 3 illustrates an exploded isometric-view 300 of the heat shield 116 and the heat-shield heat spreader 118 that may be part of a thermal-control system of a mesh network device (e.g., the thermal-control system 110 of the mesh network device 102 of FIG. 1). Also illustrated in FIG. 3 is the PCB 104. In some instances, the PCB 104 may be generally circular or elliptical in shape. The PCB 104 may also be generally symmetrical about the central axis 204.

As illustrated, the PCB 104 may include multiple IC devices (e.g., an SoC IC device 302 is identified as an example). In some instances, a respective TIM (e.g., a TIM 304) may be located between a respective IC device and a pedestal that may be included as part of a heat sink (e.g., a pedestal that may be protruding from a surface of the heat sink 112 of FIG. 1). As an example, the TIM 304 may be located between the SoC IC device 302 and a respective pedestal of the heat sink (not illustrated in FIG. 3) to create thermal contact between the SoC IC device 302 and the heat sink.

In general, the PCB 104 may include multiple IC devices with multiple TIMs. The multiple respective TIMs may, in general, reduce air gaps and/or bond line gaps to provide a thermal conduction path between the multiple IC devices and the heat sink. In some instances, one or more of the multiple respective TIMs may include a thermal pad material. In other instances, one or more of the multiple, respective TIMs may include a thermally conductive gel material or a thermally conductive grease material.

An electromagnetic interference (EMI) shield 306 may surround one or more of the multiple IC devices included on the PCB 104. In some instances, the EMI shield 306 may be positioned between a thermally conductive foam 308 and the PCB 104. The thermally conductive foam 308 may be configured to interface with a surface or pedestal of the heat sink. Consequently, the thermally conductive foam 308 creates thermal contact between the EMI shield 306 in thermal contact and the heat sink.

As illustrated, the heat-shield heat spreader 118 may be located between the heat shield 116 and the PCB 104, including IC devices that may be populating the PCB 104. In some instances, a TIM (e.g., a thermal gel material, a thermal grease material) may be located between the heat-shield heat spreader 118 and the PCB 104.

The heat-shield heat spreader 118 may include a generally straight edge 310 that, when assembled as part of a mesh network device (e.g., the mesh network device 102 of FIG. 1), runs parallel to a straight edge 312 of the heat shield 116. The straight edge 310 may allow clearance within the mesh network device for other elements or features that may be mounted to the PCB 104, such as one or more Ethernet port(s) 314. The Ethernet port(s) 314 may extend from the PCB 104 and in a direction that is substantially parallel to the central axis 204.

Figure 4:
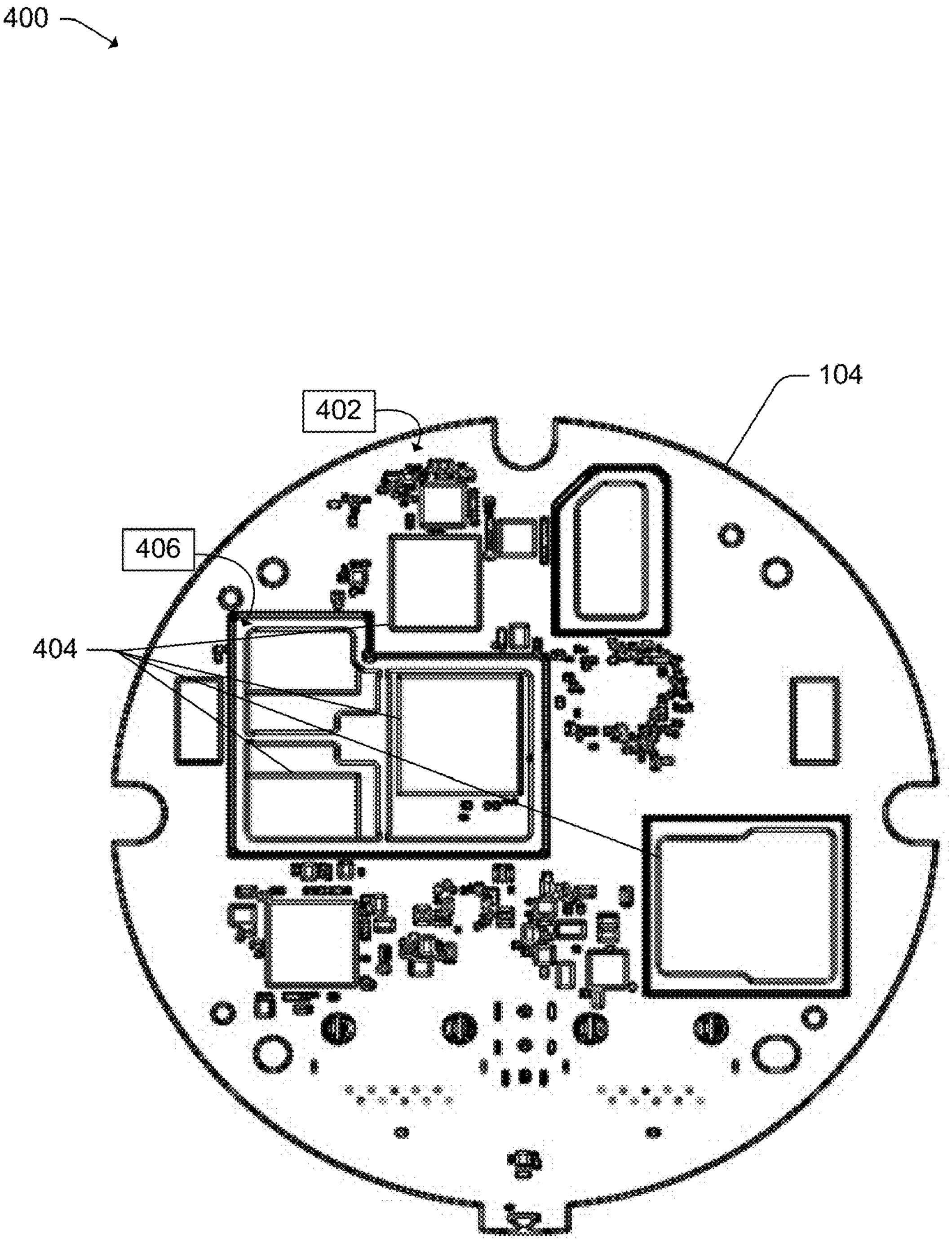
FIG. 4 illustrates a top plan view of an example PCB that may be included in a mesh network device.

FIG. 4 illustrates a top plan-view 400 of an example PCB that may be included in a mesh network device (e.g., the PCB 104 of the mesh network device 102 of FIG. 1). The PCB 104 may be a multi-layer PCB that includes a glass-reinforced epoxy laminate material (e.g., FR-4) and multiple layers of electrically conductive traces. The PCB 104 may also be a "double-sided" PCB, where different IC devices may be mounted to opposing surfaces of the PCB 104 using surface-mount (SMT) soldering techniques. In some instances, traces within the multiple layers of the PCB 104 may include a conductive material. For example, traces within the multiple layers of the PCB 104 may include a copper material. The PCB 104 may also include one or more ground planes (e.g., copper ground planes) that may each absorb, spread, and transfer heat within the PCB 104.

A first surface of the PCB 104 (e.g., a first surface 402) may be populated with a first set of IC devices 404. The first surface 402 may face a heat sink of a mesh network device (e.g., the heat sink 112 of the mesh network device 102 of FIG. 1). The first set of IC devices 404 may include, for example, one or more memory IC devices, such as double-data rate dynamic random access memory (DDR DRAM) devices. In some instances, the first set of IC devices 404 may also include the SoC IC device 302 of FIG. 3. The first set of IC devices 404 may also include an embedded multimedia card (eMMC) IC device. In some instances, an EMI shield (e.g., the EMI shield 306 of FIG. 3) may surround one or more planar regions 406 of the first surface 402 containing one or more of the first set of IC devices 404. In some instances, respective TIMs (e.g., one or more of the TIM 304 of FIG. 3) may be located between one or more of the first set of IC devices 404 and a heat sink (e.g., a pedestal included in the heat sink 112 of FIG. 1), creating thermal contact between the first set of IC 404 devices and the heat sink.

Each of the first set of IC devices 404 may electrically connect to the PCB 104 using solder connections that result from surface-mount (SMT) manufacturing techniques. In general, the first set of IC devices 404 populating the first surface 402 of the PCB 104, when operating, may contribute to a heat load (e.g., the internal heat load 106 of FIG. 1) within a mesh network device (e.g., the mesh network device 102 of FIG. 1).

Figure 5:
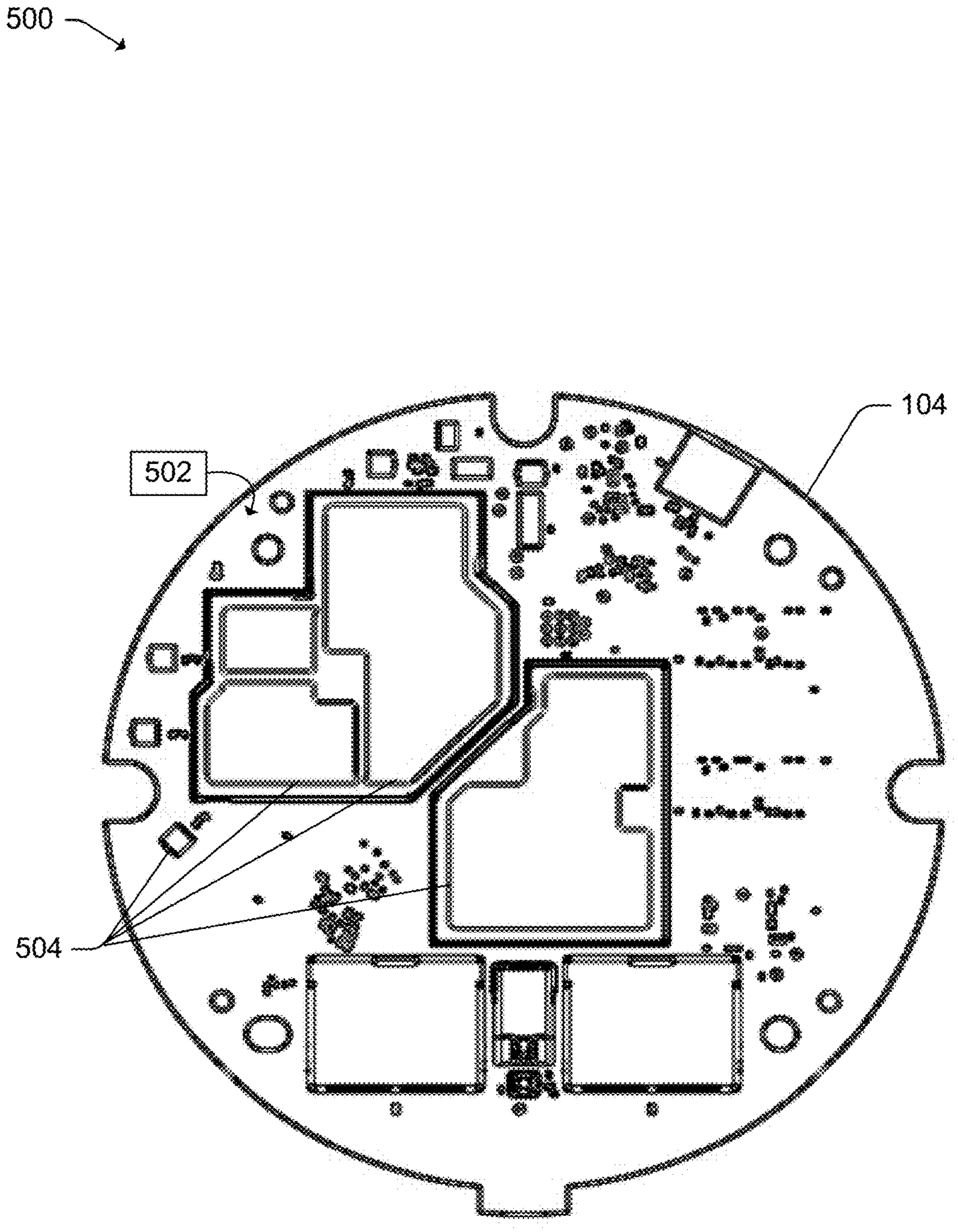
FIG. 5 illustrates a bottom plan view of the example PCB from FIG. 4.

FIG. 5 illustrates a bottom plan-view 500 of the PCB from FIG. 4, which may be included in a mesh network device (e.g., the PCB 104 of the mesh network device 102 of FIG. 1). A second surface of the PCB 104 (e.g., a second surface 502 that is opposite the first surface 402 of FIG. 4) may face a heat shield of a mesh network device (e.g., the heat shield 116 of the mesh network device 102 of FIG. 1).

The second surface 502 of the PCB 104 may be populated with a second set of IC devices 504. Examples of the second set of IC devices 504 include front end module (FEM) IC devices (e.g., 5 GHZ FEM) and radio frequency (RF) IC devices (e.g., 5 GHz RF) that may be associated with wireless communications of a wireless local area network (WLAN).

In some instances, one or more of the second set of IC devices 504 may be in thermal contact with a heat spreader (e.g., the heat-shield heat spreader 118 of FIG. 1). In some instances, a TIM (e.g., thermally conductive grease, thermally conductive gel) may be located between one or more of the second set of IC devices 504 and the heat spreader.

Each of the second set of IC devices 504 may be electrically connected to the PCB 104 using solder connections that result from SMT manufacturing techniques. In general, the second set of IC devices 404 populating the second surface 502 of the PCB 104, when operating, may contribute to a heat load (e.g., the internal heat load 106 of FIG. 1) within a mesh network device (e.g., the mesh network device 102 of FIG. 1).

Figure 6:
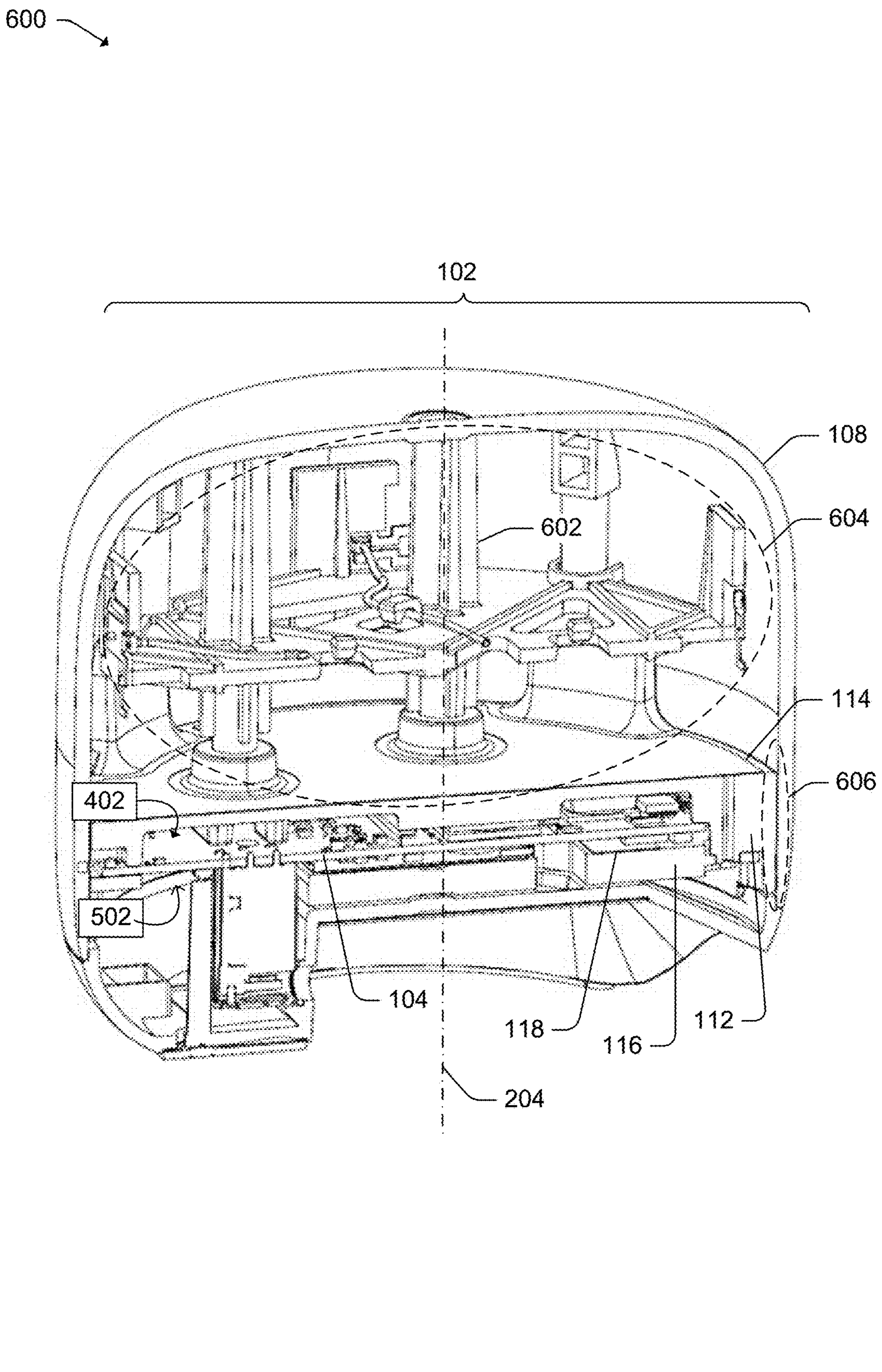
FIG. 6 illustrates an isometric section view of an example mesh network device, including a thermal-control system in accordance with one or more aspects.

FIG. 6 illustrates an isometric section view 600 of the mesh network device 102 in accordance with one or more aspects. The mesh network device 102 includes elements of a thermal-control system (e.g., the thermal-control system 110 of FIG. 1), including the heat sink 112, the heat-sink heat spreader 114, the heat shield 116, and the heat-shield heat spreader 118.

As illustrated, the PCB 104 is located between the heat sink 112 and the heat shield 116. The first surface 402 of the PCB 104 faces the heat sink 112, while the second surface 502 of the PCB 104 faces the heat shield 116.

Also illustrated in FIG. 6 is the housing component 108. In some aspects, the housing component 108 may function as an antenna radome for one or more antenna(s) 602 located in an internal cavity region 604. In some instances, the one or more antennas 602 may run substantially parallel to the central axis 204. The heat-sink heat spreader 114 may include a layer of a polyethylene terephthalate (PET) film with high-emissivity characteristics to efficiently transfer heat (e.g., radiate heat) to the internal cavity region 604.

Furthermore, and in some instances, an air-gap region 606 may separate a perimeter surface of the heat sink 112 from a complementary, interior surface of the housing component 108. The air-gap region 606 may also separate the interior surface of the housing component 108 from an exterior surface of a fin region that may be part of the heat sink 112 (e.g., the exterior surface 212 of the fin region 208 of FIG. 2). In some instances, a nominal dimension of the air-gap region 606 may measure between approximately 0.5 millimeters (mm) to 2.0 mm, effective to "tune" thermal convection and/or thermal radiation heat-transfer characteristics between the heat sink 112 and the housing component 108.

Figure 7:
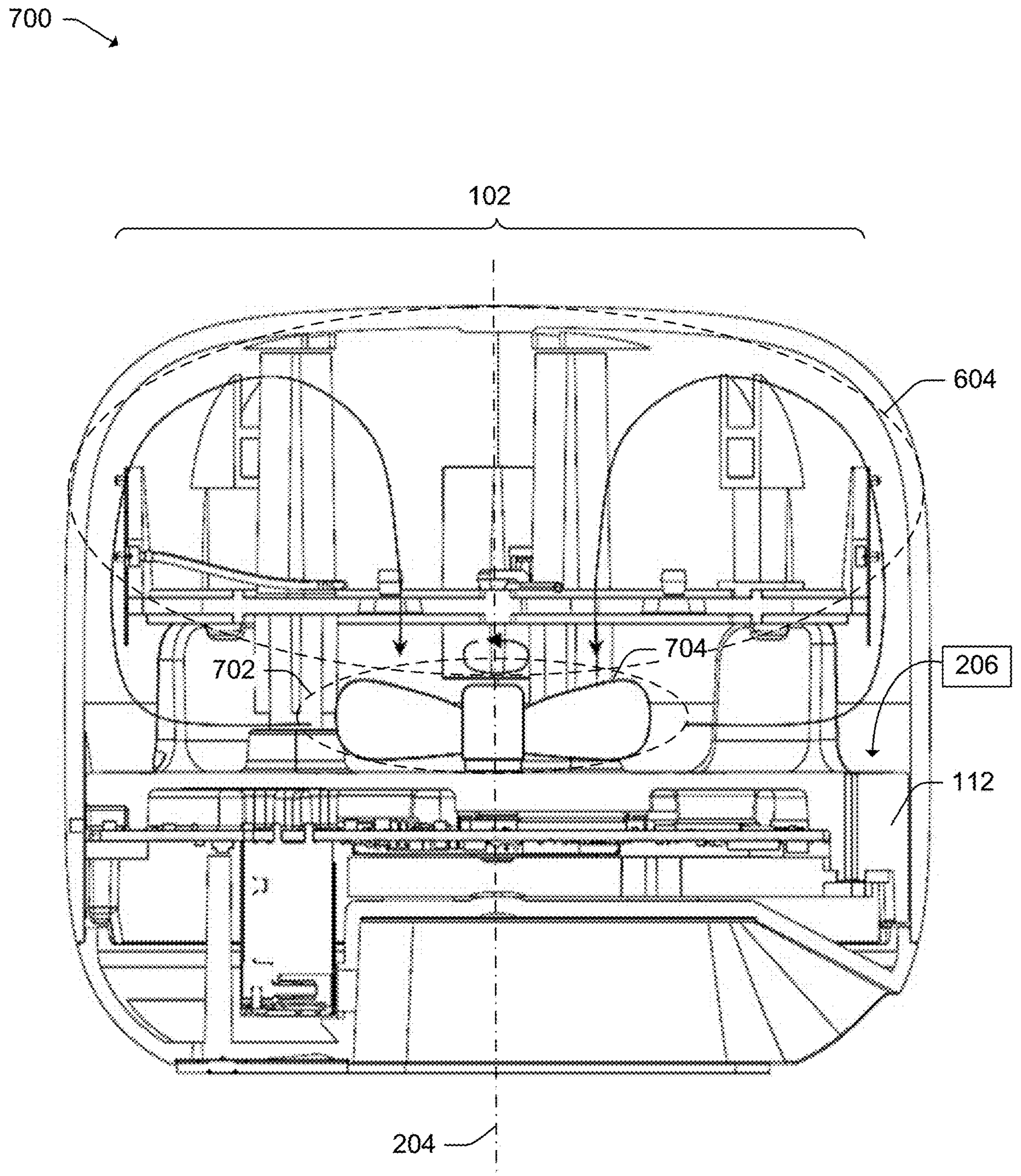
FIG. 7 illustrates a side section view of an example mesh network device, including an example fan mechanism that may be included as part of a thermal-control system.

FIG. 7 illustrates a side section view 700 of the mesh network device 102, including an example fan mechanism 702 that may be included as part of a thermal-control system (e.g., the thermal-control system 110 of FIG. 1). In general, the fan mechanism 702 may include one or more blades 704 that are configured to rotate about the central axis 204. In some instances, the one or more blades 704 may be located between the internal cavity region 604 and the first surface 206 of the heat sink 112. Furthermore, a heat spreader (e.g., the heat spreader 114 of FIG. 1) may be located between the first surface 206 of the heat sink 112 and the one or more blades 704. The fan mechanism 702, when activated, may circulate air within the internal cavity region 604. The circulation of the air within the internal cavity region 604 may, in some instances, improve convection heat-transfer mechanism characteristics within the mesh network device 102.

Figure 8:
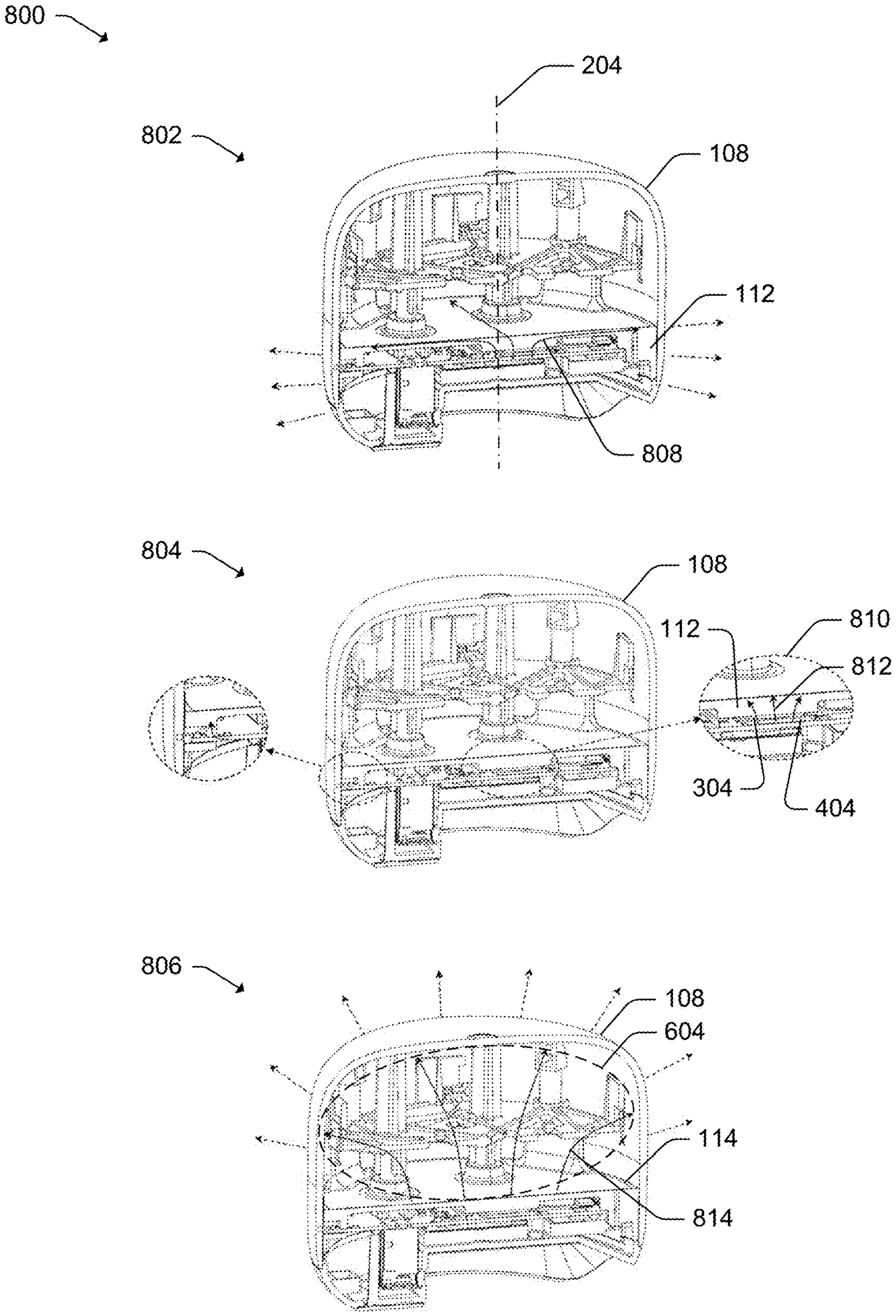
FIG. 8 illustrates another example heat transfer path that may be effectuated by a thermal-control system of a mesh network device.

FIG. 8 illustrates example details 800 of heat-transfer paths within the example mesh network device 102. The example details 800 include several instances of an isometric sectional view of the mesh network device 102, including instances 802, 804, and 806.

The top illustration of FIG. 8 illustrates the instance 802, including a first heat-transfer path 808 that transfers a portion of an internal heat load (e.g., a portion of the internal heat load 106 originating from multiple IC devices populating the PCB 104 of FIG. 1) through the heat sink 112. As illustrated, the first heat-transfer path 808 may use conduction, convection, and/or radiation heat-transfer mechanisms to transfer the portion of the internal heat load to the heat sink 112. The heat sink 112 may then, using convection, conduction, and/or radiation heat-transfer mechanisms, transfer the heat laterally, relative to the central axis, to the housing component 108. The housing component 108 may then, using convection and/or radiation heat-transfer mechanisms, transfer heat received through the first heat-transfer path 808 to the surrounding environment.

The middle illustration of FIG. 8 provides an enlarged view 810 of the instance 804 within the mesh network device 102. As illustrated, a second heat-transfer path 812 uses conduction heat-transfer mechanisms to transfer another portion of the internal heat load to the heat sink 112. As part of the second heat-transfer path 812, the TIM 304 uses thermal conduction to transfer heat from one of the one or more IC devices 404 to a pedestal of the heat sink 112. Heat transferred through the second heat-transfer path 812 may "join" with the heat of the first heat-transfer path 808 to be transferred through the housing component 108 to the surrounding environment.

The bottom illustration of FIG. 8 provides the instance 806. A third heat-transfer path 814 may use convection and/or radiation heat-transfer mechanisms to transfer another portion of the internal heat load (e.g., another portion of the internal heat load 106 originating from multiple IC devices populating the PCB 104) to the housing component 108. The third heat-transfer path 814, which includes the heat-sink heat spreader 114, may transfer heat to the internal cavity region 604 through convection and/or radiation heat-transfer mechanisms. The housing component 108 may, using convection and/or thermal heat-transfer mechanisms, transfer heat received through the third heat-transfer path 814 to the surrounding environment.

In the following paragraphs, several examples are described:

Example 1: an apparatus comprising: a printed circuit board, the printed circuit board generally circular about a central axis and populated with one or more integrated circuit devices; a thermal-control system to transfer heat generated by the one or more integrated circuit devices to a housing component of the apparatus for external dissipation, the thermal-control system comprising: a heat sink, the heat sink generally cylindrical and centered about the central axis, the heat sink including an interior disk-like body that is substantially orthogonal to the central axis and in thermal contact with at least one of the one or more integrated circuit devices; a first heat spreader, the first heat spreader generally planar and attached to a first surface of the interior disk-like body; and a heat shield, the heat shield facing a second surface of the interior disk-like body that is opposite the first surface.

Example 2: the apparatus of example 1, wherein the printed circuit board is located between the heat shield and the second surface of the interior disk-like body.

Example 3: the apparatus of example 1 or 2, wherein a second heat spreader is located between the heat shield and the printed circuit board.

Example 4: the apparatus of example 3, wherein a thermal interface material is located between the second heat spreader and the printed circuit board.

Example 5: the apparatus of any of examples 1 to 4, wherein the first surface of the interior disk-like body faces an internal cavity region of the housing component of the apparatus.

Example 6: the apparatus of example 5, further including one or more antennas located within the internal cavity region, each of the one or more antennas extending in a direction that is substantially parallel to the central axis.

Example 7: The apparatus of any of examples 1 to 6, wherein: the heat sink includes a perimeter surface; and the perimeter surface of the heat sink is separated from a complementary, interior surface of the housing component.

Example 8: the apparatus of any of examples 1 to 7, wherein the first heat spreader includes a high-emissivity polyethylene terephthalate film.

Example 9: the apparatus of any of examples 1 to 8, further including a thermal interface material, the thermal interface material located between at least one of the one or more integrated circuit devices and the heat sink.

Example 10: the apparatus of any of claims 1 to 9, wherein the heat shield includes a generally straight edge.

Example 11: an apparatus comprising: a housing component, the housing component including an internal cavity region that is generally concave and symmetrical about a central axis; a thermal-control system within the housing component, the thermal-control system configured to transfer heat generated by one or more integrated circuit devices to the housing component of the apparatus for external dissipation, the thermal-control system comprising: a heat sink that is generally cylindrical and centered about the central axis, the heat sink including an interior disk-like body that: is substantially orthogonal to the central axis; includes a first surface that faces the internal cavity region; and is in thermal contact with at least one of the one or more integrated circuit devices; a fan mechanism located between the first surface and the internal cavity region, the fan mechanism having one or more blades that rotate about the central axis; and a first heat spreader that is: generally planar; attached to the first surface; and located between the one or more blades of the fan mechanism and the first surface of the heat sink.

Example 12: the apparatus of example 11, wherein the first heat spreader includes a high-emissivity polyethylene terephthalate film.

Example 13: The apparatus of example 11 or 12, wherein the housing component houses one or more antennas in the internal cavity region of the apparatus, the one or more antennas extending in a direction that is substantially parallel to the central axis.

Example 14: the apparatus of any of examples 11 to 13, further comprising a heat shield that faces a second surface of the interior disk-like body, the second surface opposite the first surface.

Example 15: the apparatus of example 14, further comprising a printed circuit board that includes the one or more integrated circuit devices, the printed circuit board generally circular and located between the heat shield and the second surface of the interior disk-like body.

Although techniques using and apparatuses for a thermal-control system of a mesh network device and associated mesh network devices are described, it is to be understood that the subject of the appended claims is not necessarily limited to the specific features or methods described. Rather, the specific features and methods are disclosed as example ways in which a thermal-control system of a mesh network device and associated mesh network devices can be implemented.

What is claimed is:

1. An apparatus comprising:
a printed circuit board populated with one or more integrated circuit devices;
a thermal-control system configured to transfer heat generated by the one or more integrated circuit devices to a housing component of the apparatus for external dissipation, the thermal-control system comprising:
a heat sink, the heat sink centered about a central axis, the heat sink in thermal contact with at least one of the one or more integrated circuit devices;
a first heat spreader, the first heat spreader attached to a first surface of the heat sink;
a heat shield, the heat shield facing a second surface of the heat sink that is opposite the first surface; and
a second heat spreader, the second heat spreader located between the heat shield and the printed circuit board, the printed circuit board located between the heat shield and the second surface of the heat sink.

2. The apparatus of claim 1, wherein a thermal interface material is located between the second heat spreader and the printed circuit board.

3. The apparatus of claim 1, wherein:
the heat sink comprises an interior disk-like body that is substantially orthogonal to the central axis; and
the first surface of the heat sink faces an internal cavity region of the housing component of the apparatus.

4. The apparatus of claim 3, further including one or more antennas located within the internal cavity region, each of the one or more antennas extending in a direction that is substantially parallel to the central axis.

5. The apparatus of claim 1, wherein:
the heat sink includes a perimeter surface; and
the perimeter surface of the heat sink is separated from a complementary, interior surface of the housing component.

6. The apparatus of claim 1, wherein the first heat spreader includes a high-emissivity polyethylene terephthalate film.

7. The apparatus of claim 1, further including a thermal interface material, the thermal interface material located between at least one of the one or more integrated circuit devices and the heat sink.

8. The apparatus of claim 1, wherein the heat shield includes a plastic material.

9. The apparatus of claim 1, wherein the heat sink includes at least one fin region that extends from a perimeter of the heat sink in a direction that is substantially parallel to the central axis.

10. The apparatus of claim 1, further comprising a thermal interface material, wherein:
the second surface of the heat sink includes one or more protrusions; and
the thermal interface material is located between at least one of the one or more integrated circuit devices and the one or more protrusions of the heat sink.

11. An apparatus comprising:
a housing component, the housing component including an internal cavity region;
a thermal-control system configured to transfer heat generated by one or more integrated circuit devices to the housing component of the apparatus for external dissipation, the thermal-control system comprising:
a heat sink that is centered about a central axis, the heat sink including a first surface that faces the internal cavity region and is in thermal contact with at least one of the one or more integrated circuit devices;
a fan mechanism located between the first surface and the internal cavity region, the fan mechanism having one or more blades configured to rotate; and
a first heat spreader that is:
attached to the first surface of the heat sink; and
located between the one or more blades of the fan mechanism and the first surface of the heat sink.

12. The apparatus of claim 11, wherein the heat sink comprises an interior disk-like body that is substantially orthogonal to the central axis.

13. The apparatus of claim 11, wherein the housing component houses one or more antennas in the internal cavity region of the apparatus, the one or more antennas extending in a direction that is substantially parallel to the central axis.

14. The apparatus of claim 12, further comprising a heat shield that faces a second surface of the interior disk-like body, the second surface opposite the first surface.

15. The apparatus of claim 14, further comprising a printed circuit board that includes the one or more integrated circuit devices, the printed circuit board located between the heat shield and the second surface of the interior disk-like body.

16. The apparatus of claim 15, further comprising an electromagnetic interference shield that surrounds at least one of the one or more integrated circuit devices, the electromagnetic interference shield positioned between the printed circuit board and a thermally conductive foam configured to create a thermal contact between the electromagnetic interference shield and the heat sink.

17. The apparatus of claim 15, wherein a second heat spreader is located between the heat shield and the printed circuit board.

18. The apparatus of claim 17, wherein a thermal interface material is located between the second heat spreader and the printed circuit board.

19. The apparatus of claim 18, wherein the heat shield is configured to impede a transfer of heat to a base and promote a transfer of heat to the housing component.

20. The apparatus of claim 19, wherein the fan mechanism is further configured to circulate air within the internal cavity region to increase convection heat-transfer within the apparatus.

* * * * *